(12) United States Patent
Lim

(10) Patent No.: US 7,588,956 B2
(45) Date of Patent: Sep. 15, 2009

(54) CMOS IMAGE SENSOR AND METHOD OF MANUFACTURING THE SAME

(75) Inventor: Su Lim, Boocheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 182 days.

(21) Appl. No.: 11/586,880

(22) Filed: Oct. 25, 2006

(65) Prior Publication Data

US 2007/0090424 A1 Apr. 26, 2007

(30) Foreign Application Priority Data

Oct. 25, 2005 (KR) ...................... 10-2005-0100842

(51) Int. Cl.
*H01L 21/00* (2006.01)
(52) U.S. Cl. ................. 438/48; 438/59; 257/290; 257/291; 257/292; 257/E27.132; 257/E27.133
(58) Field of Classification Search .............. 257/292, 257/291, 290, E27.132, E27.133; 438/48, 438/59
See application file for complete search history.

(56) References Cited

U.S. PATENT DOCUMENTS

| 5,162,887 | A | * | 11/1992 | Dierschke | ............... | 257/465 |
| 6,946,715 | B2 | | 9/2005 | Hong | | |
| 7,037,748 | B2 | * | 5/2006 | Han | ................. | 438/73 |
| 7,205,584 | B2 | * | 4/2007 | Rhodes et al. | ............ | 257/184 |
| 7,411,234 | B2 | * | 8/2008 | Han | ................. | 257/292 |
| 2004/0161868 | A1 | | 8/2004 | Hong | | |
| 2004/0232314 | A1 | | 11/2004 | Hong | | |

(Continued)

FOREIGN PATENT DOCUMENTS

KR 10-2005-0098958 10/2005

(Continued)

OTHER PUBLICATIONS

Chang Hun Han: CMOS Image Sensor and Fabrication Method Thereof for Preventing Implantation of Impurity Ions into boundary Between Isolation Layer and Active Region for Photodiode: Korean Patent Abstracts: Publication No. 1020050029554 A; Publication Date: Mar. 28, 2005: Korean Intellectual Property Office.

(Continued)

*Primary Examiner*—Andy Huynh
(74) *Attorney, Agent, or Firm*—The Law Offices of Andrew D. Fortney; Andrew D. Fortney

(57) ABSTRACT

Disclosed herein are a CMOS image sensor and a method of manufacturing the same, which can reduce current leakage through a plug connecting a photodiode and a transfer transistor to each other, and thereby provide low dark current levels. The CMOS image sensor includes a first epitaxial layer on or in a substrate. A photodiode PD is in the first epitaxial layer. A second epitaxial layer is on or in the substrate (e.g., on the first epitaxial layer). A shallow trench isolation region is in an area of the substrate. A plug is in the substrate (e.g., the second epitaxial layer) connected with the photodiode and spaced apart from the shallow trench isolation region. A transfer transistor having a gate electrode and source/drain regions is connected with the plug.

17 Claims, 5 Drawing Sheets

U.S. PATENT DOCUMENTS

2005/0064620 A1 3/2005 Han
2005/0280045 A1* 12/2005 Forbes .................. 257/225
2005/0280046 A1* 12/2005 Shin ..................... 257/226
2006/0006436 A1* 1/2006 Mouli ................... 257/290

FOREIGN PATENT DOCUMENTS

KR 10-0558530 3/2006
WO WO 2004/075299 A1 9/2004

OTHER PUBLICATIONS

Sungkwon Chris Hong; CMOS Image Sensor and Method of Fabrication: Laid-Open Patent Gazette: Publication No. 10-2005-0098958; Publication Date: Oct. 12, 2005; Korean Patent Office.

* cited by examiner

CMOS IMAGE SENSOR AND METHOD OF MANUFACTURING THE SAME

This application claims the benefit of Korean Application No. 10-2005-0100842, filed on Oct. 25, 2005, which is incorporated by reference herein in its entirety.

BACKGROUND OF THE INVENTION

1. Field of the Invention

The present invention relates to a CMOS image sensor. Particularly, the present invention relates to a CMOS image sensor and a method of manufacturing the same, which can mitigate current leakage through a plug connecting a photodiode with a transfer transistor, to thereby enable or provide a low dark current.

2. Background of the Related Art

An image sensor is a semiconductor device that converts one- or two-dimensional optical information into electrical signals. Such an image sensor is largely categorized into a metal-oxide-semiconductor (MOS) type and a charge coupled device (CCD) type.

A CMOS image sensor is a device that converts an optical image into an electrical signal using the CMOS. Such a CMOS image sensor employs a switching mode where a number of MOS transistors corresponding to the number of pixels are formed and used for sensing outputs thereof in a consecutive manner. The CMOS image sensor enables a simplified driving mode, as compared with conventional CCD image sensors, and allows for various scanning modes. In addition, the signal processing circuitry can be integrated into a single chip to allow for miniaturization of products. Furthermore, a compatible CMOS technology can be used, resulting in a reduction in manufacturing cost and power consumption.

FIG. 1 is a circuit diagram showing a unit pixel in a CMOS image sensor having four transistors and two capacitance structures. The unit pixel of FIG. 1 includes a photodiode PD for optical-sensing and four NMOS transistors. The four transistors include a transfer transistor Tx for transferring photons (optical charges) generated in the photodiode to a floating diffusion region (designated $C_f$ in FIG. 1), a reset transistor Rx for discharging the charges stored in the floating diffusion region for signal detection, a drive transistor Dx for driving the signal detected in the floating diffusion region and serving as a source follower, and a select transistor Sx for switching and addressing signals at the pixel level. In the figures, "Cf" denotes a floating diffusion region and "Cp" denotes a photodiode capacitance.

The above-configured unit pixel of image sensor is operated as follows. First, the reset transistor Rx, the transfer transistor Tx and the select transistor Sx are turned on to reset the unit pixel. At this time, the photodiode begins to be depleted and carrier changing (or charging) may occur in the capacitance Cp. The capacitance Cf in the floating diffusion region is charged up to the supply voltage $V_{DD}$. Then, the transfer transistor Tx is turned off, the select transistor Sx is turned on and then the reset transistor Rx is turned off. At this operational state, an output voltage V1 is read from the output terminal Out of the unit pixel, and stored in a buffer. Thereafter, the transfer transistor Tx is turned on so that the capacitance Cp changed (or charged) according to the light-intensity may be transferred to the floating diffusion region (i.e., capacitance Cf). Then, again, the output terminal Out reads another output voltage V2 and converts the analog data for "V1-V2" into a digital data, thus completing one period or cycle of operation for the unit pixel.

Hereafter, a connection configuration of a conventional photodiode towards the gate of a transfer transistor will be described hereafter.

FIGS. 2a and 2b are plan view and sectional view showing the connection between a photodiode and a transfer transistor according to the related art.

A connection between the photodiode and the transfer transistor in the conventional CMOS image sensor will be described hereinafter. As shown in FIGS. 2a and 2b, a first epitaxial layer 11 is formed on a substrate 10. A photodiode PD 13 is formed within the first epitaxial layer 11 of the substrate 10.

In addition, a second epitaxial layer 14 is formed on the substrate 10 where the photodiode 13 is formed (e.g., on the photodiode 13). A shallow trench isolation (STI) region 15 is formed at a certain area of the substrate 10 (e.g., in the second epitaxial layer 14). The substrate 10, except for the shallow trench isolation region 15, comprises a well region injected with P-type ions and serves as an active region 16.

In addition, a plug 18 injected with $n^+$ ions is formed within the substrate 10 so as to allow the plug 18 to be connected with the photodiode 13. Here, the plug 18 is made in a region overlapping with (e.g., coupled to) the shallow trench isolation region 15.

Further, a transfer transistor is formed at the transfer transistor region of pixel so as to be connected with the plug 18.

Specifically, a gate insulation film 19 and a gate electrode 20 are stacked on the substrate 10. A sidewall spacer 21 is formed at side walls of the gate electrode 20. Source/drain regions 22a and 22b are formed in the substrate 10 at sides of the gate electrode 20 and the sidewall spacer 21. A lightly doped drain (LDD) region 23 is also formed in the substrate 10 underneath the sidewall spacer 21 and the edge of the gate electrode 20.

Furthermore, the source region 22a of the transfer transistor is connected with the plug 18, and thus, the transfer transistor and the photodiode 13 are connected to each other.

Conventional CMOS image sensors having the above construction have drawbacks as follows.

The plug region exists in the interface of the shallow trench isolation (STI) region, thereby causing vulnerability to leakage current, which occurs by $n^+$ ions injected with a high energy at the STI interface. Therefore, maximum performance may not be expected in the CMOS image sensor (CIS) process where low dark current is of importance.

SUMMARY OF THE INVENTION

The present invention has been made in order to solve the above problems in the art. It is an object of the invention to provide a CMOS image sensor and a method of manufacturing the same, which can reduce current leakage through a plug connecting a photodiode and a transfer transistor to each other, to thereby enable or provide a low dark current.

In order to accomplish the above object, according to one aspect of the invention, there is provided a CMOS image sensor having a photodiode and a transfer transistor. The image sensor includes: a first epitaxial layer in or on a substrate; a photodiode PD in the first epitaxial layer of the substrate; a second epitaxial layer on the first epitaxial layer; a shallow trench isolation region in an area of the substrate; a plug in the substrate connected with the photodiode and spaced apart from the shallow trench isolation region; and a transfer transistor having a gate electrode and source/drain regions, connected with the plug.

The transfer transistor generally includes: a gate insulation film and a gate electrode stacked on the substrate; a sidewall spacer on side walls of the gate electrode; source/drain regions in the substrate at opposite sides of the gate electrode and the sidewall spacer(s); and a lightly doped drain (LDD) region in the substrate under the sidewall spacer and an edge of the gate electrode. Alternatively, the photodiode may be in the substrate (e.g., a single-crystal silicon wafer or an epitaxial layer thereon). Consequently, the plug, the STI region, the source/drain regions, and the LDD region(s) may be in the epitaxial layer on the substrate (which may be the second epitaxial layer).

Generally, the source region of the transfer transistor is connected with the plug.

According to another aspect of the invention, there is provided a method of manufacturing a CMOS image sensor having a photodiode and a transfer transistor. The method includes the steps of: forming a first epitaxial layer on a substrate; forming a photodiode PD in the first epitaxial layer; forming a second epitaxial layer on the first epitaxial layer; forming a shallow trench isolation region in an area of the substrate; forming a plug within the substrate connected with the photodiode and spaced apart from the shallow trench isolation region; and forming a transfer transistor having a gate electrode and source/drain regions, connected with the plug.

The plug forming step may include the steps of: coating a photosensitive film on the substrate and then patterning the photosensitive film so as not to expose (i.e., to cover completely) the shallow trench isolation region; and injecting ions into the substrate at a depth sufficient to form the plug connected with photodiode, using the patterned photosensitive film as a mask.

The transfer transistor forming step includes one or more of the steps of: laminating a gate insulation film and a gate electrode on the substrate; injecting impurity ions of low concentration into the substrate at opposite sides of the gate electrode; forming a sidewall spacer at a side wall of the gate electrode; forming source/drain regions in the substrate at opposite sides of the gate electrode and the sidewall spacer; and forming a lightly doped drain region in the substrate under the spacer and/or an edge of the gate electrode.

DETAILED DESCRIPTION OF THE PREFERRED EMBODIMENT

Hereafter, a CMOS image sensor and a method of manufacturing the same according to preferred embodiments of the invention will be described hereinafter with reference to the accompanying drawings.

First, the construction of a CMOS image sensor according to an embodiment of the invention will be described hereinafter.

Figure 1:
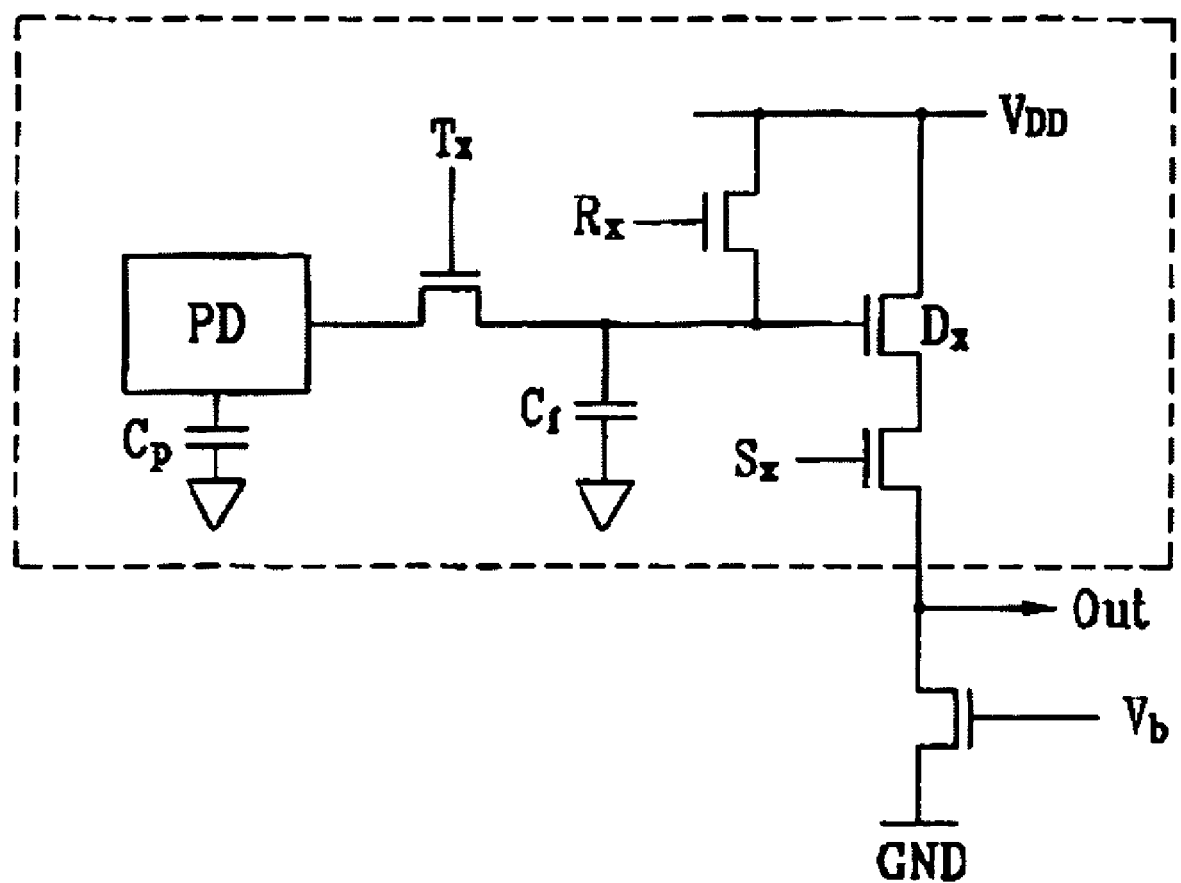
FIG. 1 is a circuit diagram showing a unit pixel in a conventional CMOS image sensor having four transistors and two capacitance structures.
Figure 2A:
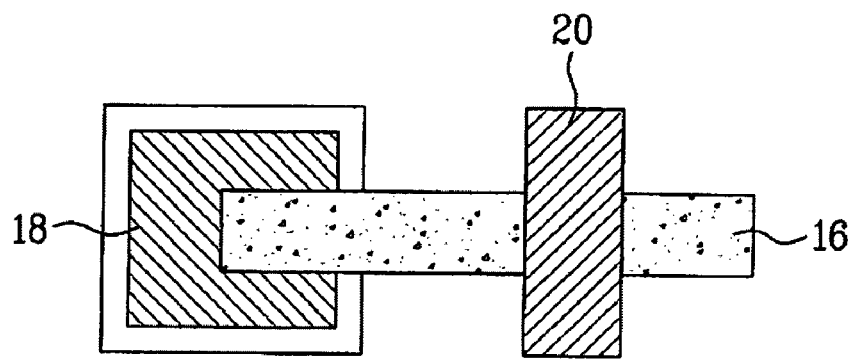
FIGS. 2a and 2b are plan view and sectional view showing the connection between a photodiode and a transfer transistor according to the related art.
Figure 2B:
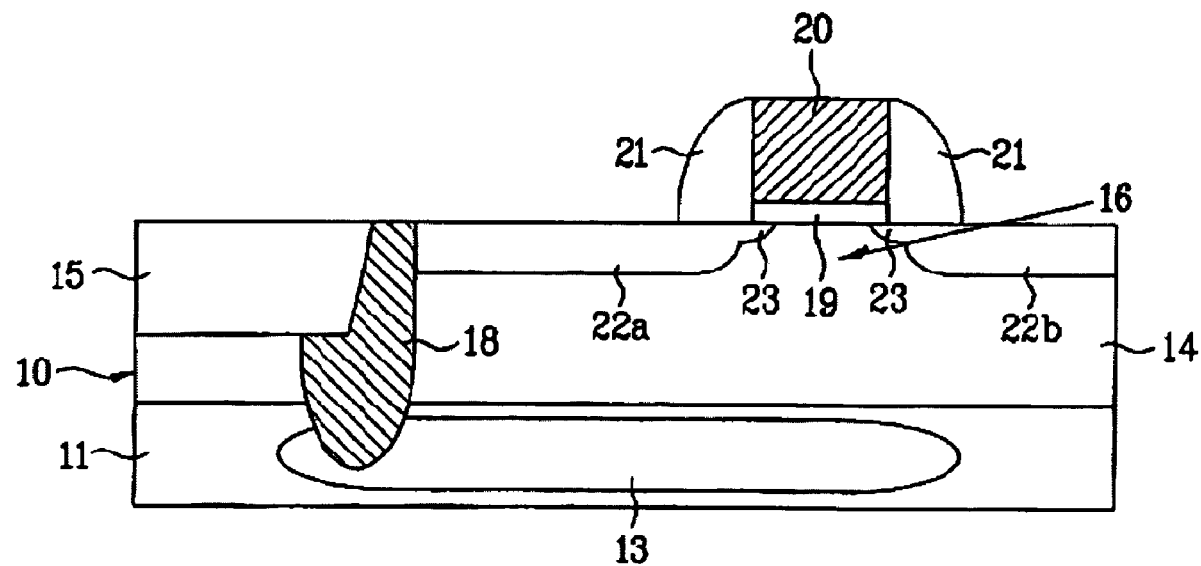
Figure 3A:
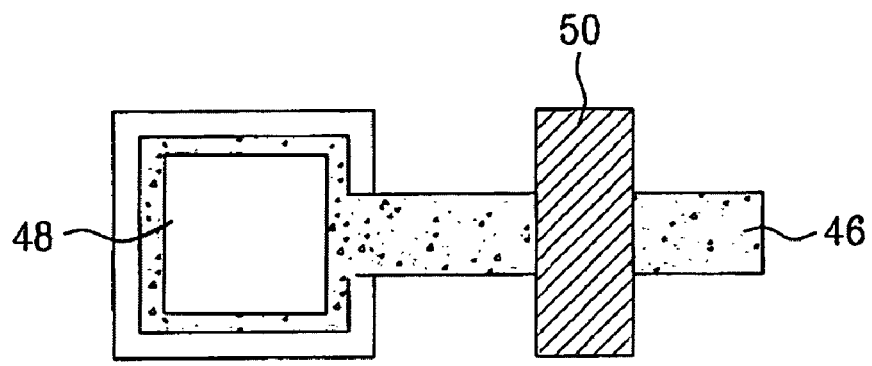
FIGS. 3a and 3b are plan view and cross-sectional view showing the connection between a photodiode and a transfer transistor according to an embodiment of the invention.
Figure 3B:
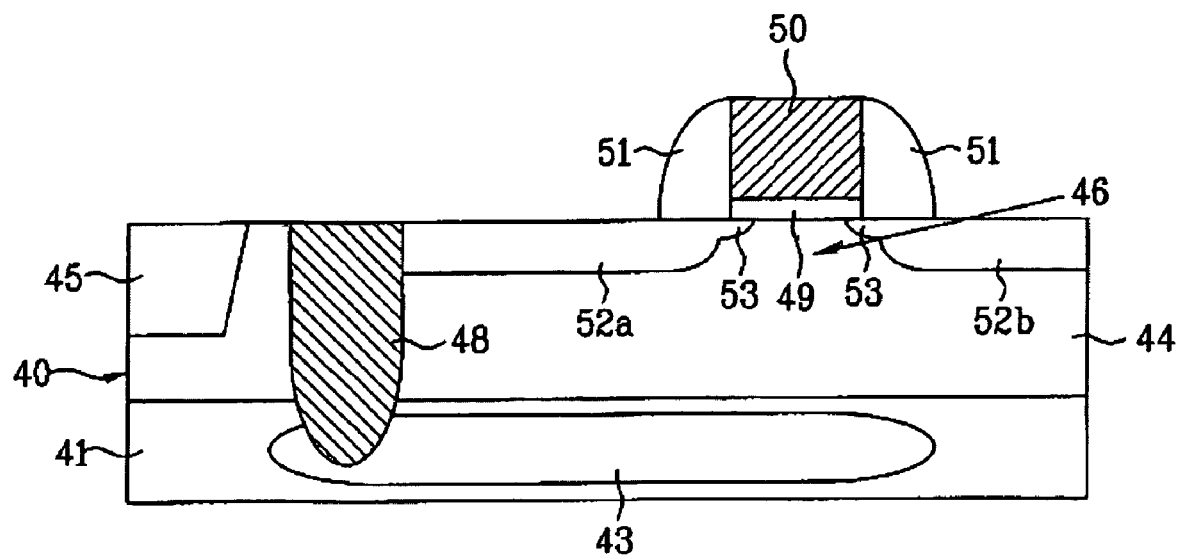

FIGS. 3a and 3b are plan view and sectional view showing the connection between a photodiode and a transfer transistor according to an embodiment of the invention.

The connection between the photodiode and the transfer transistor in the CMOS image sensor of the invention will be described hereinafter. As shown in FIGS. 3a and 3b, a first epitaxial layer 41 is formed on or in a substrate 40. Alternatively, the substrate 40 may comprise a first epitaxial layer 41. A photodiode PD 43 is formed within the first epitaxial layer 41 of the substrate 40.

In addition, a second epitaxial layer 44 is formed on the substrate 40 where the photodiode 43 is formed. Thus, the substrate 40 may comprise a second epitaxial layer 44, or a second epitaxial layer 44 formed on the first epitaxial layer 41 of the substrate 40. A shallow trench isolation (STI) region 45 is formed at a certain area of the substrate 40, generally in the second epitaxial layer 44. The substrate 40, except for the shallow trench isolation region 45, may comprise a well region injected with P-type ions that serves as or provides an active region 46.

In addition, a plug 48 which may be injected with $n^+$ ions is formed in the substrate 40 (and in particular, second epitaxial layer 44) so as to allow the plug 48 to be connected with the photodiode 43. Thus, the ions that form plug 48 are implanted at a concentration and with an energy sufficient to form a plug passing completely through second epitaxial layer 44, enabling contact with photodiode 43. Here, the plug 48 is spaced apart from the shallow trench isolation region 45 by a certain distance. In one embodiment, the distance between plug 48 and shallow trench isolation region 45 provides a sufficient margin of error for the photolithographic exposure and development processes used to form STI region 45 and plug 48 to ensure some minimal spacing between STI region 45 and plug 48. For example, in a 0.25 micron photolithography process, the target spacing (or the minimum spacing) may be at least 50, 60, 75, 90 or 100 nm.

Further, a transfer transistor is formed at the transfer transistor region of pixel so as to be connected with the plug 48.

Specifically, a gate insulation film 49 and a gate electrode 50 are stacked on the substrate 40. A sidewall spacer 51 is formed at the side wall of the gate electrode 50. Source/drain regions 52a and 52b injected with impurity ions (e.g., $n^+$) of high concentration are formed in the substrate 40 at both sides of the gate electrode 50 and the sidewall spacer 51. At this time, a lightly doped drain (LDD) region 53 may be formed in the substrate 40 underneath the edge of the gate electrode 50. Alternatively, LDD regions 53 are formed prior to formation of spacer(s) 51 by conventional ion implantation, and the spacer(s) 51 are subsequently formed over LDD regions 53.

Furthermore, the source region 52a of the transfer transistor is connected with the plug 48, and thus, the transfer transistor and the photodiode 43 are connected to each other.

Hereafter, a method of manufacturing a CMOS image sensor having the above-construction according to an embodiment of the invention will be described hereinafter.

FIGS. 4a to 4d are sectional views showing procedures for forming a photodiode and a transfer transistor according to an embodiment of the invention.

The present invention is directed to a method of forming a vertical CMOS image sensor, in which a plug region connecting a photodiode to the gate of a transfer transistor is separated from the interface of a shallow trench isolation region (i.e., ion injection for the plug is made into the active region only), thereby eliminating current leakage occurring from implanting a relatively high concentration of relatively high-energy dopant ions at the interface of the shallow trench isolation (STI) 45 with the active region 46 (see, e.g., FIGS.

3A-3B). Therefore, a method of manufacturing the photodiode PD and the transfer transistor will be described hereinafter below.

Figure 4A:
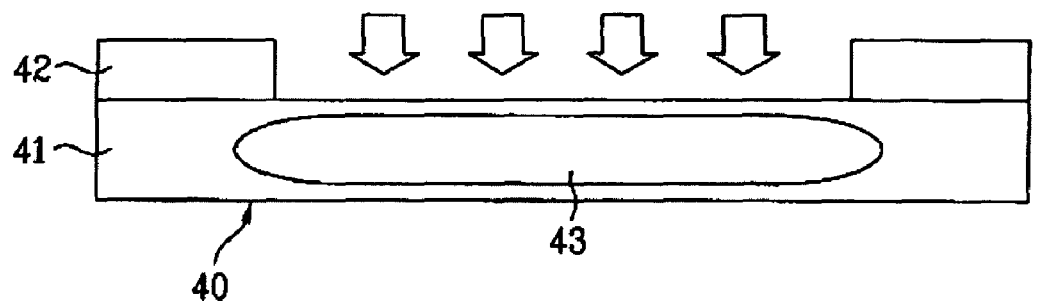
FIGS. 4a to 4d are cross-sectional views showing procedures for forming a photodiode and a transfer transistor according to an embodiment of the invention.

First, as shown in FIG. 4a, a first epitaxial layer 41 is formed in or on a substrate 40. Then, after coating a first photosensitive film 42 on the substrate 40, the first photosensitive film 42 is selectively patterned through a light-exposure and developing process in such a way as to expose only an area for forming a photodiode.

Thereafter, using the patterned first photosensitive film 42 as a mask, ions are injected into the first epitaxial layer 41 to form a photodiode PD 43.

Figure 4B:
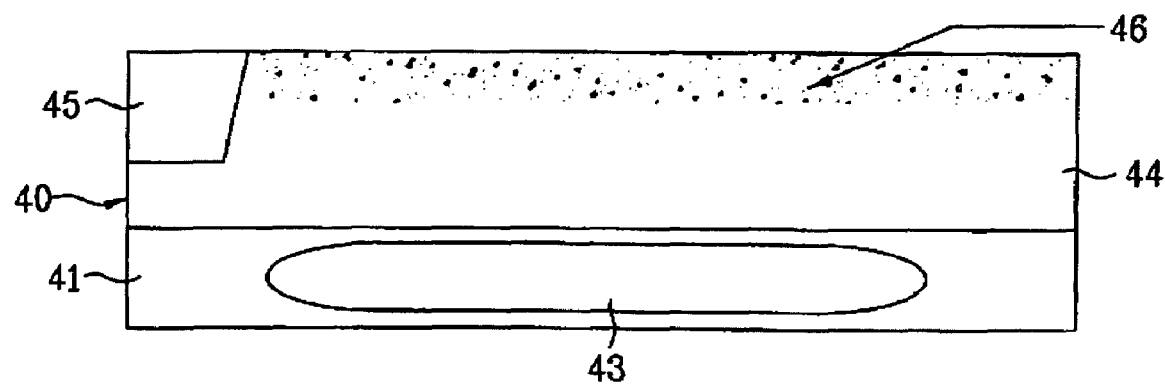

Then, as shown in FIG. 4b, a second epitaxial layer 44 is formed on the substrate 40 (and particularly on the first epitaxial layer 41) having the photodiode 43 formed therein. After that, a shallow trench is formed at a certain area of the substrate 40 through a photolithographic process. An insulation film is deposited in the trench and on top surface of the substrate 40. The insulation film is then planarized (e.g., by chemical mechanical polishing) such that it is left in the shallow trench region only, to thereby form a shallow trench isolation (STI) region 45. In addition, P-type ions are injected into the substrate 40, except for the shallow trench isolation region 45, resulting in formation of an active region 46 in the surface of the substrate 40.

Figure 4C:
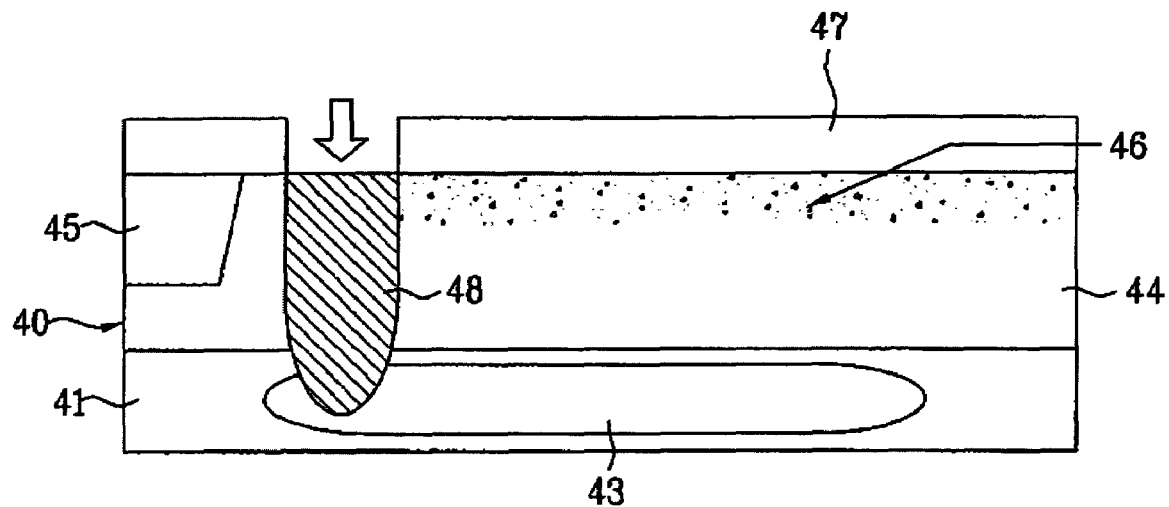

Thereafter, as shown in FIG. 4c, a second photosensitive film 47 is coated on the substrate 40. Then, the second photosensitive film 47 is selectively patterned through a light-exposure and developing process so as to expose only an area for forming a plug. In other words, the second photosensitive film 47 completely covers STI region 45, as well as a (minimum) space between STI region 45 and plug region 48 as described elsewhere herein.

Then, using the patterned second photosensitive film 47 as a mask, $n^+$ ions are injected into the substrate 40 to form a plug. At this time, the $n^+$ ion injection for formation of the plug is carried out such that $n^+$ ions are injected to a depth of the photodiode PD 43 in order for the plug 48 to be connected with the photodiode 43.

Further, the second photosensitive film 47 is patterned so as not to expose the shallow trench isolation region 45, so that the plug is spaced apart from the shallow trench isolation region 45 by a certain distance, as described herein.

Figure 4D:
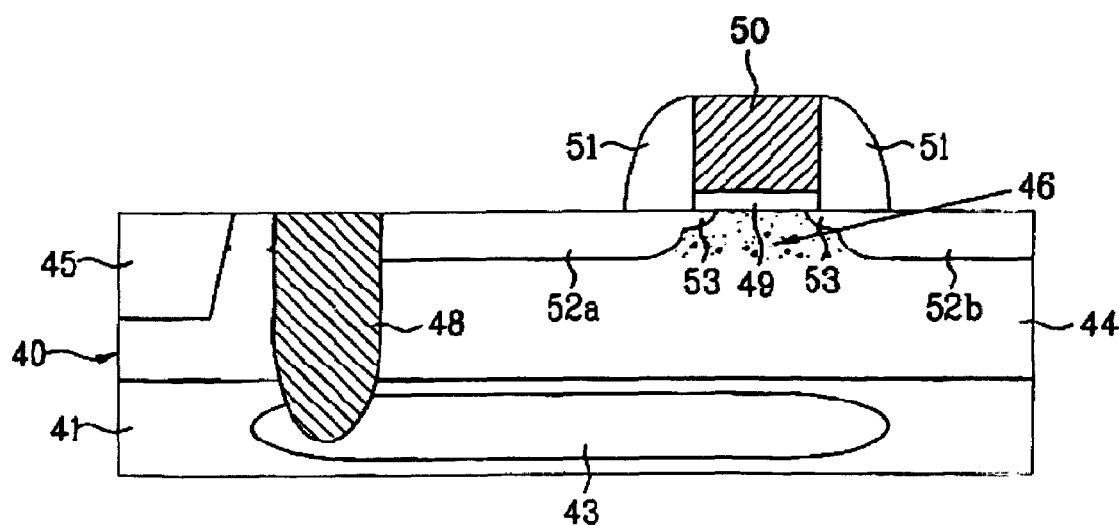

Next, as shown in FIG. 4d, in order to form a transfer transistor of pixel, after depositing a gate isolation film 49 and a polysilicon layer, a photolithographic and etching process is carried out to form a gate insulation film 49 and a gate electrode 50 at desired regions.

Thereafter, although not illustrated in the figures, using a mask not exposing (i.e., covering) the gap between the shallow trench isolation region 45 and the plug 48, impurity ions are injected at a low concentration into the surface of the substrate 40 at both sides of the gate electrode 50. An insulation film is deposited on the top surface of the substrate 40 and then etched back (e.g., by anisotropic and/or dry etching) to form a sidewall spacer 51 on the side wall of the gate electrode 50. Next, although not illustrated in the figures, using a mask not exposing (i.e., covering) an area between the shallow trench region and the plug 48, impurity ions are injected at a high concentration (e.g. $n^+$) into the substrate 40 at opposite sides of the gate electrode 50 and the sidewall spacer 51 to form source/drain regions 52a and 52b. A lightly doped drain (LDD) 53 is also formed under an edge of the gate electrode 50 where the impurity ions are injected at a low concentration. In one embodiment, the ions for forming the LDD 53 are implanted before the spacers 51 are formed.

At this time, the plug 48 is connected with the source region 52a, and thus the transfer transistor and the photodiode 43 are connected with each other.

The above explanation and drawings have been illustrated as manufacturing a single transistor, but other transistors constituting a CMOS image sensor can be formed according to a typical CMOS manufacturing process.

As described above, the CMOS image sensor and the method of manufacturing the same according to the invention has advantageous effects as follows.

In the vertical CMOS image sensor process, a plug connecting the photodiode to the transfer transistor is relocated towards the active region of the transfer transistor and then isolated from the shallow trench region. Thus, leakage current caused by $n^+$ ions injected with a high energy at the interface between the STI region and the active region can be eliminated. Accordingly, improved or optimal performance can be obtained or provided in the CIS process, where low dark current is of importance.

Although the present invention has been described with reference to several exemplary embodiments, the description is illustrative of the invention and is not to be construed as limiting the invention. Various modifications, variations and replacements may occur to those skilled in the art, without departing from the spirit and scope of the invention as defined by the appended claims.

What is claimed is:

1. A method of manufacturing a CMOS image sensor having a photodiode and a transfer transistor, the method comprising the steps of:
    forming a photodiode in a substrate comprising a first epitaxial layer;
    forming a second epitaxial layer on the first epitaxial layer of the substrate;
    forming a shallow trench isolation region in the second epitaxial layer;
    forming a plug in the second epitaxial layer connected with the photodiode and spaced a predetermined minimum distance apart from the shallow trench isolation region by patterning a photosensitive film to cover the shallow trench isolation region completely, and injecting ions into the second epitaxial layer to a depth sufficient to form the plug; and
    forming a transfer transistor having a gate electrode and source/drain regions, connected with the plug.

2. The method as claimed in claim 1, wherein the plug forming step further comprises coating the photosensitive film on the second epitaxial layer prior to patterning the photosensitive film.

3. The method as claimed in claim 2, wherein the ions injected to form the plug are n-type ions.

4. The method as claimed in claim 3, wherein the n-type ions comprise a high concentration of ions.

5. The method as claimed in claim 1, wherein the transfer transistor forming step comprises the steps of:
    forming a gate insulation film on the second epitaxial layer and the gate electrode on the gate insulation film; and
    injecting impurity ions at a low concentration into the second epitaxial layer at opposite sides of the gate electrode.

6. The method as claimed in claim 1, wherein the transfer transistor forming step further comprises the steps of:
    forming a sidewall spacer at a side wall of the gate electrode; and
    forming source/drain regions in the second epitaxial layer at opposite sides of the gate electrode and the sidewall spacer.

7. The method as claimed in claim 6, wherein the transfer transistor forming step further comprises the steps of:
   forming a lightly doped drain (LDD) region adjacent to the gate electrode.

8. The method as claimed in claim 1, wherein the CMOS image sensor is a vertical CMOS image sensor.

9. The method as claimed in claim 1, wherein the substrate comprises the first epitaxial layer thereon.

10. The method as claimed in claim 9, comprising forming the first epitaxial layer on the substrate.

11. The method as claimed in claim 9, wherein the substrate comprises the second epitaxial layer thereon.

12. The method as claimed in claim 11, comprising forming the second epitaxial layer on the first epitaxial layer.

13. The method as claimed in claim 11, wherein the photodiode is formed in the first epitaxial layer.

14. The method as claimed in claim 1, further comprising forming a well region in the second epitaxial layer that serves as or provides an active region.

15. The method as claimed in claim 14, wherein forming the well region comprises injecting P-type ions into the second epitaxial layer.

16. The method as claimed in claim 1, wherein the substrate comprises a second epitaxial layer formed on the first epitaxial layer.

17. The method as claimed in claim 1, wherein the predetermined minimum distance between the plug and the shallow trench isolation region provides a sufficient margin of error for photolithographic exposure and development processes.

* * * * *